United States Patent
Wang

(10) Patent No.: US 10,770,163 B2
(45) Date of Patent: Sep. 8, 2020

(54) SHIFT REGISTER UNIT, METHOD OF DRIVING SHIFT REGISTER UNIT, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Zhichong Wang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 25 days.

(21) Appl. No.: 16/158,735

(22) Filed: Oct. 12, 2018

(65) Prior Publication Data

US 2019/0304559 A1    Oct. 3, 2019

(30) Foreign Application Priority Data

Mar. 30, 2018   (CN) .......................... 2018 1 0291691

(51) Int. Cl.
*G11C 19/28*   (2006.01)
*G09G 3/20*    (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2310/08* (2013.01)

(58) Field of Classification Search
CPC ......... G11C 19/287; G09G 2310/0286; G09G 3/3611; G09G 3/3266; G09G 2300/0426
See application file for complete search history.

(56) References Cited

U.S. PATENT DOCUMENTS

| | | | |
|---|---|---|---|
| 2011/0033022 A1 | 2/2011 | Zebedee et al. | |
| 2016/0365052 A1* | 12/2016 | Park | G09G 3/3677 |
| 2017/0115807 A1* | 4/2017 | Cho | G06F 3/0416 |

(Continued)

FOREIGN PATENT DOCUMENTS

| | | |
|---|---|---|
| CN | 105632451 A | 6/2016 |
| CN | 106023914 A | 10/2016 |

(Continued)

OTHER PUBLICATIONS

First Chinese Office Action dated Mar. 3, 2020; Appln No. 201810291691.3.

*Primary Examiner* — Abbas I Abdulselam

(57) ABSTRACT

A shift register unit, a method of driving a shift register unit, a gate driving circuit and a display device are provided. The shift register unit includes an input circuit, a first pull-up node reset circuit and an output circuit. The input circuit is configured to control an level of a pull-up node to a first level in response to an input signal of an input terminal, and thereafter control a level of a first node to a second level under control of a level of a pull-down node. The first node is in a current path for controlling the level of the pull-up node. The first pull-up node reset circuit is configured to reset the pull-up node in response to a first reset signal. The output circuit is configured to output a clock signal to an output terminal under control of the level of the pull-up node.

19 Claims, 7 Drawing Sheets

(56) References Cited

U.S. PATENT DOCUMENTS

2017/0344179 A1* 11/2017 Kim .................... G09G 3/3688
2018/0047366 A1* 2/2018 Kang ................... G09G 3/3225
2018/0226132 A1 8/2018 Gao et al.
2019/0139475 A1 5/2019 Wang et al.

FOREIGN PATENT DOCUMENTS

| CN | 107657983 A | 2/2018 |
| GB | 2459661 A | 11/2009 |
| WO | 2012169590 A1 | 12/2012 |

* cited by examiner

US 10,770,163 B2

SHIFT REGISTER UNIT, METHOD OF DRIVING SHIFT REGISTER UNIT, GATE DRIVING CIRCUIT AND DISPLAY DEVICE

CROSS-REFERENCE TO RELATED APPLICATIONS

The application claims priority to the Chinese patent application No. 201810291691.3, filed on Mar. 30, 2018, the entire disclosure of which is incorporated herein by reference as part of the present application.

TECHNICAL FIELD

Embodiments of the present disclosure relate to a shift register unit, a method of driving a shift register unit, a gate driving circuit and a display device.

BACKGROUND

In the field of display technology, for example, a pixel array of a liquid crystal display panel generally comprises a plurality of rows of gate lines and a plurality of columns of data lines intersecting with the gate lines. The driving of gate lines may be achieved by a bounded integrated driving circuit. In recent years, with continuous improvement of the manufacturing process of amorphous silicon thin film transistors or oxide thin film transistors, gate line driving circuit may be directly integrated on a thin film transistor array substrate to form a gate driver on array (GOA) to drive the gate lines. For example, a GOA comprising a plurality of cascaded shift register units may be used to provide on-off state voltage signals for the plurality of rows of gate lines of the pixel array, thereby, for example, controlling the plurality of rows of gate lines to be sequentially turned on, and meanwhile, data lines provide data signals for pixel units of the corresponding rows of the pixel array to form gray level voltages required for each gray level when displaying image in each pixel unit, thereby displaying a frame of image. Present display panels increasingly adopt GOA technology to drive gate lines. GOA technology helps achieve narrow borders and may reduce production costs.

SUMMARY

At least one embodiment of the present disclosure provides a shift register unit, comprising an input circuit, a first pull-up node reset circuit and an output circuit; wherein the input circuit comprises an input terminal, and is configured to control an level of a pull-up node to a first level in response to an input signal of the input terminal, and thereafter control a level of a first node to a second level under control of a level of a pull-down node, in which the first node is in a current path for controlling the level of the pull-up node; the first pull-up node reset circuit is configured to reset the pull-up node in response to a first reset signal; and the output circuit is configured to output a clock signal to an output terminal under control of the level of the pull-up node.

For example, in the shift register unit provided by an embodiment of the present disclosure, the input circuit comprises a first input sub-circuit, a second input sub-circuit and a first node control sub-circuit; the first input sub-circuit is configured to control the level of the first node to the first level in response to the input signal; the second input sub-circuit is configured to control the level of the pull-up node to the first level in response to the input signal; and the first node control sub-circuit is configured to control the level of the first node to the second level under control of the level of the pull-down node.

For example, in the shift register unit provided by an embodiment of the present disclosure, the first input sub-circuit comprises a first transistor, in which a gate electrode of the first transistor is configured to be connected to the input terminal to receive the input signal, a first electrode of the first transistor is configured to be connected to a first voltage terminal to receive a first voltage, and a second electrode of the first transistor is configured to be connected to the first node; the second input sub-circuit comprises a second transistor, in which a gate electrode of the second transistor is configured to be connected to the input terminal to receive the input signal, a first electrode of the second transistor is configured to be connected to the first node, and a second electrode of the second transistor is configured to be connected to the pull-up node; and the first node control sub-circuit comprises a third transistor, in which a gate electrode of the third transistor is configured to be connected to the pull-down node, a first electrode of the third transistor is configured to be connected to the first node, and a second electrode of the third transistor is configured to be connected to a second voltage terminal to receive a second voltage.

For example, the shift register unit provided by an embodiment of the present disclosure comprises a pull-down circuit, a pull-down control circuit, a pull-up node noise reduction circuit and an output noise reduction circuit; wherein the pull-down circuit is configured to control the level of the pull-down node under control of the level of the pull-up node and a level of a pull-down control node; the pull-down control circuit is configured to control the level of the pull-down control node under control of the level of the pull-up node; the pull-up node noise reduction circuit is configured to perform noise reduction on the pull-up node under control of the level of the pull-down node; and the output noise reduction circuit is configured to perform noise reduction on the output terminal under control of the level of the pull-down node.

For example, in the shift register unit provided by an embodiment of the present disclosure, the first pull-up node reset circuit is further configured to control a level of a second node to the second level under control of the level of the pull-down node, and the second node is in a reset path for resetting the pull-up node.

For example, in the shift register unit provided by an embodiment of the present disclosure, the first pull-up node reset circuit comprises a first reset sub-circuit, a second reset sub-circuit and a second node control sub-circuit; the first reset sub-circuit is configured to reset the second node in response to the first reset signal; the second reset sub-circuit is configured to reset the pull-up node in response to the first reset signal; and the second node control sub-circuit is configured to control the level of the second node to the second level under control of the level of the pull-down node.

For example, in the shift register unit provided by an embodiment of the present disclosure, the first reset sub-circuit comprises a fourth transistor, in which a gate electrode of the fourth transistor is configured to be connected to a first reset terminal to receive the first reset signal, a first electrode of the fourth transistor is configured to be connected to a third voltage terminal to receive a third voltage, and a second electrode of the fourth transistor is configured to be connected to the second node; the second reset sub-circuit comprises a fifth transistor, in which a gate electrode of the fifth transistor is configured to be connected to the first reset terminal to receive the first reset signal, a first electrode of the fifth transistor is configured to be connected to the second node, and a second electrode of the fifth transistor is configured to be connected to the pull-up node; and the second node control sub-circuit comprises a sixth transistor, in which a gate electrode of the sixth transistor is configured to be connected to the pull-down node, a first electrode of the sixth transistor is configured to be connected to the second node, and a second electrode of the sixth transistor is configured to be connected to a second voltage terminal to receive a second voltage.

For example, in the shift register unit provided by an embodiment of the present disclosure, the output circuit comprises a seventh transistor and a first capacitor; a gate electrode of the seventh transistor is configured to be connected to the pull-up node, a first electrode of the seventh transistor is configured to be connected to a clock signal terminal to receive the clock signal, and a second electrode of the seventh transistor is configured to be connected to the output terminal; and a first electrode of the first capacitor is configured to be connected to the gate electrode of the seventh transistor, and a second electrode of the first capacitor is configured to be connected to the second electrode of the seventh transistor.

For example, in the shift register unit provided by an embodiment of the present disclosure, the pull-down circuit comprises an eighth transistor and a ninth transistor; a gate electrode of the eighth transistor is configured to be connected to the pull-down control node, a first electrode of the eighth transistor is configured to be connected to a clock signal terminal to receive the clock signal, and a second electrode of the eighth transistor is configured to be connected to the pull-down node; and a gate electrode of the ninth transistor is configured to be connected to the pull-up node, a first electrode of the ninth transistor is configured to be connected to the pull-down node, and a second electrode of the ninth transistor is configured to be connected to a second voltage terminal to receive a second voltage.

For example, in the shift register unit provided by an embodiment of the present disclosure, the pull-down control circuit comprises a tenth transistor and an eleventh transistor; a gate electrode of the tenth transistor is connected to a first electrode of the tenth transistor and configured to be connected to a clock signal terminal to receive the clock signal, and a second electrode of the tenth transistor is configured to be connected to the pull-down control node; and a gate electrode of the eleventh transistor is configured to be connected to the pull-up node, a first electrode of the eleventh transistor is configured to be connected to the pull-down control node, and a second electrode of the eleventh transistor is configured to be connected to a second voltage terminal to receive a second voltage.

For example, in the shift register unit provided by an embodiment of the present disclosure, the pull-up node noise reduction circuit comprises a twelfth transistor; and a gate electrode of the twelfth transistor is configured to be connected to the pull-down node, a first electrode of the twelfth transistor is configured to be connected to the pull-up node, and a second electrode of the twelfth transistor is configured to be connected to a second voltage terminal to receive a second voltage.

For example, in the shift register unit provided by an embodiment of the present disclosure, the output noise reduction circuit comprises a thirteenth transistor, and a gate electrode of the thirteenth transistor is configured to be connected to the pull-down node, a first electrode of the thirteenth transistor is configured to be connected to the output terminal, and a second electrode of the thirteenth transistor is configured to be connected to a second voltage terminal to receive a second voltage.

For example, the shift register unit provided by an embodiment of the present disclosure comprises a second pull-up node reset circuit; wherein the second pull-up node reset circuit is configured to reset the pull-up node in response to a second reset signal.

For example, in the shift register unit provided by an embodiment of the present disclosure, the second pull-up node reset circuit comprises a fourteenth transistor, and a gate electrode of the fourteenth transistor is configured to be connected to a second reset terminal to receive the second reset signal, a first electrode of the fourteenth transistor is configured to be connected to the pull-up node, and a second electrode of the fourteenth transistor is configured to be connected to a second voltage terminal to receive a second voltage.

For example, the shift register unit provided by an embodiment of the present disclosure comprises an output reset circuit; wherein the output reset circuit is configured to reset the output terminal in response to a second reset signal.

For example, in the shift register unit provided by an embodiment of the present disclosure, the output reset circuit comprises a fifteenth transistor; and a gate electrode of the fifteenth transistor is configured to be connected to a second reset terminal to receive the second reset signal, a first electrode of the fifteenth transistor is configured to be connected to the output terminal, and a second electrode of the fifteenth transistor is configured to be connected to a second voltage terminal to receive a second voltage.

At least one embodiment of the present disclosure further provides a gate driving circuit, comprising the shift register unit provided by any one of the embodiments of the present disclosure.

At least one embodiment of the present disclosure further provides a display device, comprising the gate driving circuit provided by any one of the embodiments of the present disclosure.

At least one embodiment of the present disclosure further provides a method of driving the shift register unit provided by at least one embodiment of the present disclosure, comprising: in a first phase, the input circuit controlling the level of the pull-up node to the first level in response to the input signal, and the output circuit outputting a third level of the clock signal to the output terminal; in a second phase, the output circuit outputting a fourth level of the clock signal to the output terminal; in a third phase, the first pull-up node reset circuit resetting the pull-up node under control of the first reset signal; and in a fourth phase, the input circuit controlling the level of the first node to the second level under control of the level of the pull-down node.

At least one embodiment of the present disclosure further provides a method of driving the shift register unit provided by at least one embodiment of the present disclosure, wherein the input signal and the first reset signal are exchanged with each other, and the method comprises: in a first phase, the first pull-up node reset circuit controls the level of the pull-up node to the first level in response to the input signal, and the output circuit outputs a third level of the clock signal to the output terminal; in a second phase, the output circuit outputs a fourth level of the clock signal to the output terminal; in a third phase, the input circuit resets the pull-up node under control of the first reset signal; and in a fourth phase, the first pull-up node reset circuit controls the level of the second node to the second level under control of the level of the pull-down node.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1:
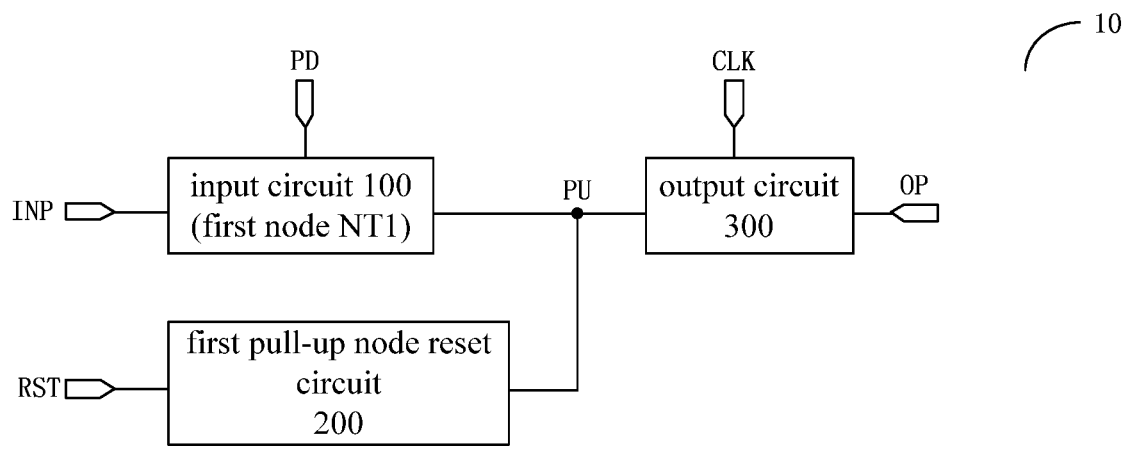
FIG. 1 is a schematic block diagram of a shift register unit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the increasing number of customers of products related to display panels, demands for display panels are also increasingly diverse. Different customers have different requirements for scanning way of display panels. For example, some customers want to put the panel upside, and start scanning from the first row; while others want to put the panel upside down and start scanning from the last row. In order to meet the requirements of customers, GOA circuits have gradually introduced the concept of dual-direction scanning. The so-called dual-direction scanning is that display panel can start scanning from the first row (forward scanning) or from the last row (reverse scanning). In this way, display panel can finally display an upright image whether the display panel is placed upside or upside down to match the entire device.

However, in a GOA circuit with a dual-direction scanning function, the stress on the input transistor during the forward scanning is different from the stress on the input transistor during the reverse scanning. Input transistors connected to high voltage terminal are prone to occurring a negative offset of threshold voltage due to long-term negative bias thermal stress (NBTS). In a case where the threshold voltage is negatively offset, when the scanning direction is switched, a pull-up node is difficult to maintain due to electric leakage after charging, thereby resulting in no output of the GOA. In a case where the GOA circuit uses an oxide transistor (such as using an indium gallium zinc oxide (IGZO) as an active layer), it is more prone to a no-output phenomenon of the GOA due to the instability of the oxide transistor itself.

At least one embodiment of the present disclosure provides a shift register unit, a method of driving a shift register unit, a gate driving circuit and a display device. The shift register unit can avoid the no-output phenomenon of the GOA circuit after the scanning direction is switched due to the negative offset of the threshold voltage of the transistors at the input terminal, which enhances the reliability of the circuit and provides a large offset margin of the threshold voltage.

Hereinafter, embodiments of the present disclosure will be described in detail with reference to the accompanying drawings. It should be noted that the same reference symbol is used in different drawings to refer to the same described component.

At least one embodiment of the present disclosure provides a shift register unit, comprising an input circuit, a first pull-up node reset circuit and an output circuit. The input circuit comprises an input terminal, and is configured to control an level of a pull-up node to a first level in response to an input signal of the input terminal and thereafter control a level of a first node to a second level under control of a level of a pull-down node, in which the first node is in a current path for controlling the level of the pull-up node. The first pull-up node reset circuit is configured to reset the pull-up node in response to a first reset signal. The output circuit is configured to output a clock signal to an output terminal under control of the level of the pull-up node.

FIG. 1 is a schematic block diagram of a shift register unit provided by an embodiment of the present disclosure. Referring to FIG. 1, a shift register unit 10 comprises an input circuit 100, a first pull-up node reset circuit 200 and an output circuit 300.

The input circuit 100 comprises an input terminal INP, and is configured to control a level of a pull-up node PU to a first level in response to an input signal of the input terminal INP (for example, the pull-up node PU is charged in this process), and thereafter control a level of a first node NT1 to a second level under control of a level of a pull-down node PD (for example, the first node NT1 is discharged in this process). The first node NT1 is in a current path for controlling the level of the pull-up node PU, for example, in a charging path that charges the pull-up node PU. For example, the first level is a high level, and the second level is a low level. The following embodiments are the same as the above, which is not described again. For example, the input circuit 100 is connected to the input terminal INP and the pull-down node PD, and is configured to electrically connect the pull-up node PU to an additionally provided high voltage terminal under control of the input signal provided by the input terminal INP, thereby enabling a high level signal outputted from the high voltage terminal to charge the pull-up node PU, so as to increase the voltage of the pull-up node PU to control the output circuit 300 to be turned on.

For example, the input circuit 100 can electrically connect the first node NT1 to an additionally provided low voltage terminal under control of the level of the pull-down node PD, thereby allowing the first node NT1 to be discharged. In this way, transistors in the input circuit 100 that is electrically connected to the first node NT1 and the pull-up node PU maintain a zero bias state, thereby eliminating the risk of threshold voltage offset and preventing the pull-up node PU from forming a leakage path, so as to avoid the no-output phenomenon after the scanning direction of the GOA circuit is switched and enhance the reliability of the circuit.

The first pull-up node reset circuit 200 is configured to reset the pull-up node PU in response to a first reset signal. For example, the first pull-up node reset circuit 200 is configured to be connected to a first reset terminal RST, thereby electrically connecting the pull-up node PU to a low level signal or a low voltage terminal under control of the first reset signal inputted by the first reset terminal RST, so as to reset the pull-up node PU (for example, pulling down the pull-up node PU to the second level).

The output circuit 300 is configured to output a clock signal to an output terminal OP as an output signal of the shift register unit 10, under control of the level of the pull-up node PU, so as to drive, for example, a gate line connected to the output terminal OP. For example, the output circuit 300 is connected to a clock signal terminal CLK and the output terminal OP, and is configured to be turned on under control of the level of the pull-up node PU, so that the clock signal terminal CLK and the output terminal OP are electrically connected, thereby allowing the clock signal inputted by the clock signal terminal CLK to be outputted to the output terminal OP.

Figure 2:
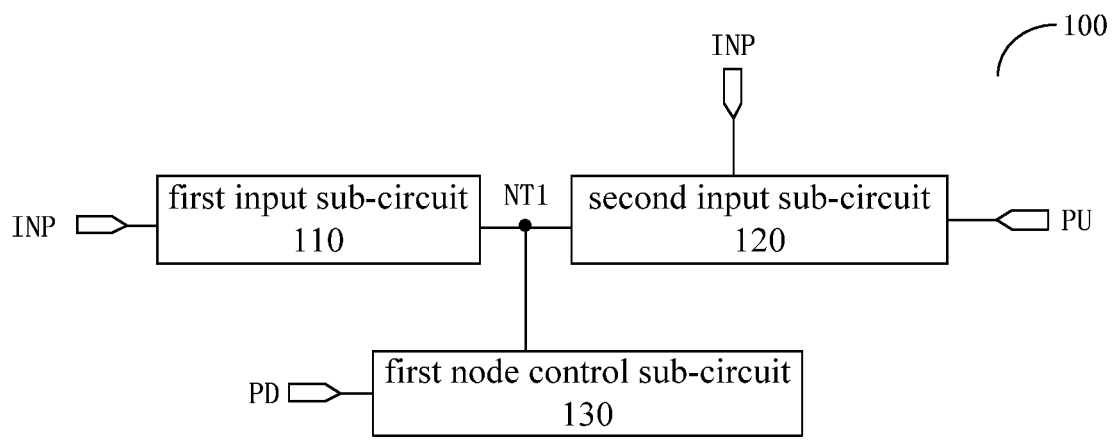
FIG. 2 is a schematic block diagram of an input circuit of a shift register unit provided by an embodiment of the present disclosure.

FIG. 2 is a schematic block diagram of an input circuit of a shift register unit provided by an embodiment of the present disclosure. Referring to FIG. 2, the input circuit 100 comprises a first input sub-circuit 100, a second input sub-circuit 120 and a first node control sub-circuit 130.

The first input sub-circuit 110 is configured to control the level of the first node NT1 to the first level in response to the input signal (for example, charging the first node NT1 to the first level). For example, the first input sub-circuit 110 is connected to the input terminal INP, and is configured to electrically connect the first node NT1 to an additionally provided high voltage terminal under control of the input signal provided by the input terminal INP, thereby allowing a high level signal outputted from the high voltage terminal to charge the first node NT1 to the first level. The high voltage terminal, for example, is a first voltage terminal VFD, and the first voltage terminal VFD, for example, can be configured to keep inputting a direct-current high level signal, so as to charge the first node NT1. The direct-current high level, for example, is the first level.

The second input sub-circuit 120 is configured to control the level of the pull-up node PU to the first level in response to the input signal (for example, charging the pull-up node PU to the first level). For example, the second input sub-circuit 120 is connected to the input terminal INP, and is configured to electrically connect the first node NT1 to the pull-up node PU under control of the input signal provided by the input terminal INP, so as to allow the high level signal of the first node NT1 to charge the pull-up node PU to the first level.

The first node control sub-circuit 130 is configured to control the level of the first node NT1 to the second level under control of the level of the pull-down node PD (for example, discharging the first node NT1 to the second level). For example, the first node control sub-circuit 130 is connected to the pull-down node PD, and is configured to electrically connect the first node NT1 to an additionally provided low voltage terminal under control of the level of the pull-down node PD, so as to allow the first node NT1 to be discharged. The low voltage terminal, for example, is a second voltage terminal VGL, and the second voltage terminal VGL, for example, can be configured to keep inputting a direct-current low level signal, the direct-current low level being described as a second voltage. The following embodiments are the same as the above, which is not described again. In this way, transistor in the second input sub-circuit 120 maintains a zero bias state, thereby eliminating the risk of threshold voltage offset and preventing the pull-up node PU from forming a leakage path, so as to avoid the no-output phenomenon after the scanning direction of the GOA circuit is switched.

Figure 3:
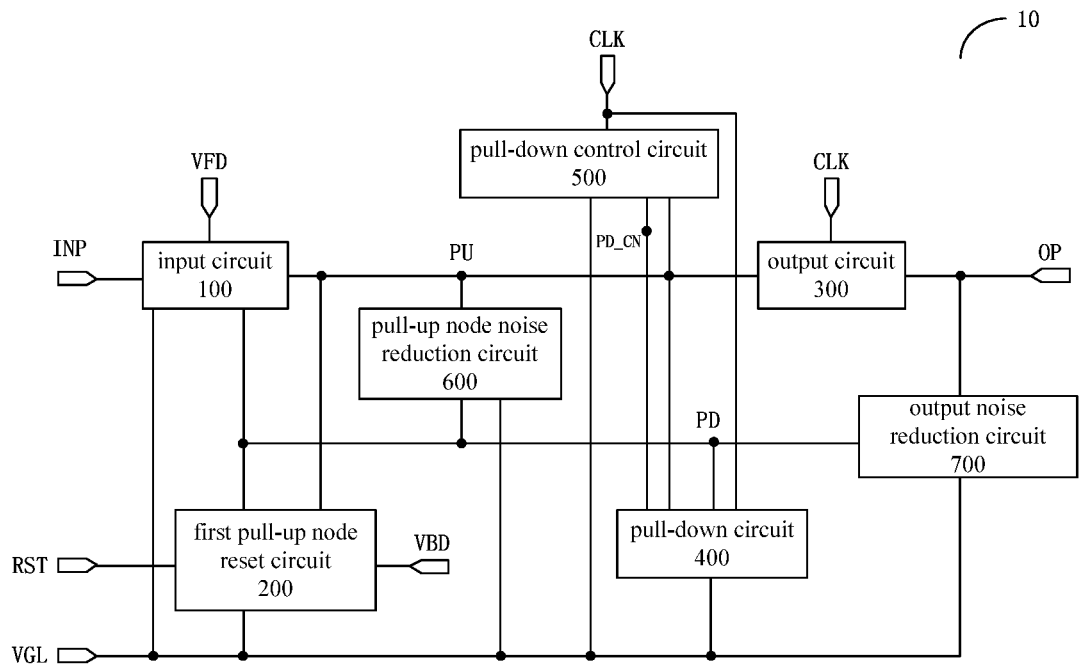
FIG. 3 is a schematic block diagram of another shift register unit provided by an embodiment of the present disclosure.

FIG. 3 is a schematic block diagram of another shift register unit provided by an embodiment of the present disclosure. Referring to FIG. 3, the shift register unit 10 may further comprise a pull-down circuit 400, a pull-down control circuit 500, a pull-up node noise reduction circuit 600 and an output noise reduction circuit 700, and other structures are substantially the same as the shift register unit 10 illustrated in FIG. 1.

The pull-down circuit 400 is configured to control the level of the pull-down node PD under control of the level of the pull-up node PU and a level of a pull-down control node PD_CN. For example, the pull-down circuit 400 is connected to the second voltage terminal VGL, the clock signal terminal CLK, the pull-up node PU, the pull-down node PD and the pull-down control node PD_CN, to electrically connect the pull-down node PD to the second voltage terminal VGL under control of the level of the pull-up node PU, thereby performing pull-down control on the level of the pull-down node PD and allowing the pull-down node PD to be at a low level. Simultaneously, the pull-down circuit 400 can electrically connect the pull-down node PD to the clock signal terminal CLK under control of the level of the pull-down control node PD_CN, thereby charging the pull-down node PD to a high level when the clock signal is at a high level and discharging the pull-down node PD when the clock signal is at a low level.

The pull-down control circuit 500 is configured to control the level of the pull-down control node PD_CN under control of the level of the pull-up node PU. For example, the pull-down control circuit 500 is connected to the second voltage terminal VGL, the clock signal terminal CLK, the pull-up node PU and the pull-down control node PD_CN, to electrically connect the pull-down control node PD_CN to the second voltage terminal VGL under control of the level of the pull-up node PU, thereby performing pull-down control on the level of the pull-down control node PD_CN and allowing the pull-down control node PD_CN to be at a low level. Furthermore, the pull-down control circuit 500 can allow the pull-down control node PD_CN to be at a high level when the clock signal is at a high level.

The pull-up node noise reduction circuit 600 is configured to perform noise reduction on the pull-up node PU under control of the level of the pull-down node PD. For example, the pull-up node noise reduction circuit 600 is configured to be connected to the second voltage terminal VGL, the pull-up node PU and the pull-down node PD, to electrically connect the pull-up node PU to the second voltage terminal VGL under control of the level of the pull-down node PD, thereby performing pull-down noise reduction on the pull-up node PU.

The output noise reduction circuit 700 is configured to perform noise reduction on the output terminal OP under control of the level of the pull-down node PD. For example, the output noise reduction circuit 700 is configured to be connected to the second voltage terminal VGL, the output terminal OP and the pull-down node PD, to electrically connect the output terminal OP to the second voltage terminal VGL under control of the level of the pull-down node PD, thereby performing pull-down noise reduction on the output terminal OP.

It should be noted that, in this embodiment, the input circuit 100 is connected to the first voltage terminal VFD, and the first pull-up node reset circuit 200 is connected to a third voltage terminal VBD. For example, output signals of the first voltage terminal VFD and the third voltage terminal VBD can be switched between a high level and a low level as needed. For example, the first voltage terminal VFD can be configured to keep inputting a direct-current high level signal (VDD), and the third voltage terminal VBD can be configured to keep inputting a direct-current low level signal (VSS). Moreover, the first voltage terminal VFD can be switched to keep inputting a direct-current low level signal (VSS), and the third voltage terminal VBD can be switched to keep inputting a direct-current high level signal (VDD). The level of the output signal of the first voltage terminal VFD is described as a first voltage, and the level of the output signal of the third voltage terminal VBD is described as a third voltage. The following embodiments are the same as the above, which is not described again.

Figure 4:
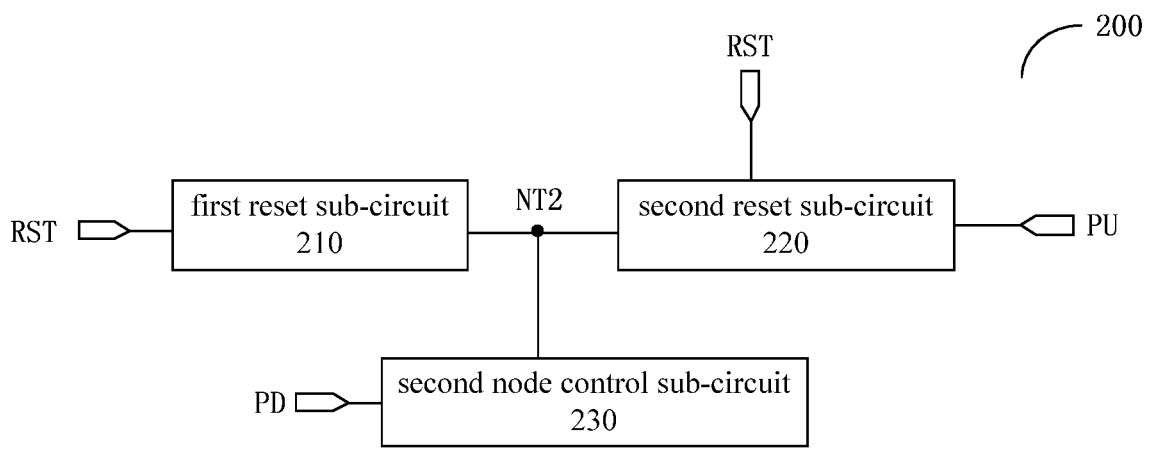
FIG. 4 is a schematic block diagram of a first pull-up node reset circuit of a shift register unit provided by an embodiment of the present disclosure.

FIG. 4 is a schematic block diagram of a first pull-up node reset circuit of a shift register unit provided by an embodiment of the present disclosure. For example, the first pull-up node reset circuit 200 is further configured to control a level of a second node NT2 to the second level under control of the level of the pull-down node PD (for example, discharging the second node NT2 to the second level). For example, the second node NT2 is in a reset path for resetting the pull-up node PU. For example, as illustrated in FIG. 4, the first pull-up node reset circuit 200 comprises a first reset sub-circuit 210, a second reset sub-circuit 220 and a second node control sub-circuit 230.

The first reset sub-circuit 210 is configured to reset the second node NT2 in response to the first reset signal. For example, the first reset sub-circuit 210 is connected to the first reset terminal RST, and is configured to electrically connect the second node NT2 to an additionally provided low voltage terminal under control of the first reset signal provided by the first reset terminal RST, thereby resetting the second node NT2. The low voltage terminal, for example, is the third voltage terminal VBD, and the third voltage terminal VBD, for example, can be configured to keep inputting a direct-current low level signal, thereby resetting the second node NT2.

The second reset sub-circuit 220 is configured to reset the pull-up node PU in response to the first reset signal. For example, the second reset sub-circuit 220 is connected to the first reset terminal RST, and is configured to electrically connect the second node NT2 to the pull-up node PU under control of the first reset signal provided by the first reset terminal RST, so as to allow the low level signal of the second node NT2 to reset the pull-up node PU.

The second node control sub-circuit 230 is configured to control the level of the second node NT2 to the second level under control of the level of the pull-down node PD (for example, discharging the second node NT2 to the second level). For example, the second node control sub-circuit 230 is connected to the pull-down node PD, and is configured to electrically connect the second node NT2 to an additionally provided low voltage terminal under control of the level of the pull-down node PD, so as to allow the second node NT2 to be discharged. The low voltage terminal, for example, is the second voltage terminal VGL.

In this embodiment, the first pull-up node reset circuit 200 and the input circuit 100 can be considered to be in a symmetric arrangement, so the shift register unit 10 can be used for dual-direction scanning. When a display panel using the shift register unit 10 performs the forward scanning (i.e., providing the input signal for the input terminal INP and providing the first reset signal for the first reset terminal RST), the operation thereof is as described above. And when the display panel using the shift register unit 10 performs the reverse scanning (i.e., providing the input signal for the first reset terminal RST and providing the first reset signal for the input terminal INP), the second node control sub-circuit 230 can discharge the second node NT2, to enable transistor in the second reset sub-circuit 220 to maintain a zero bias state, thereby eliminating the risk of threshold voltage offset and preventing the pull-up node PU from forming a leakage path, so as to avoid the no-output phenomenon after the scanning direction of the GOA circuit is switched.

Figure 5:
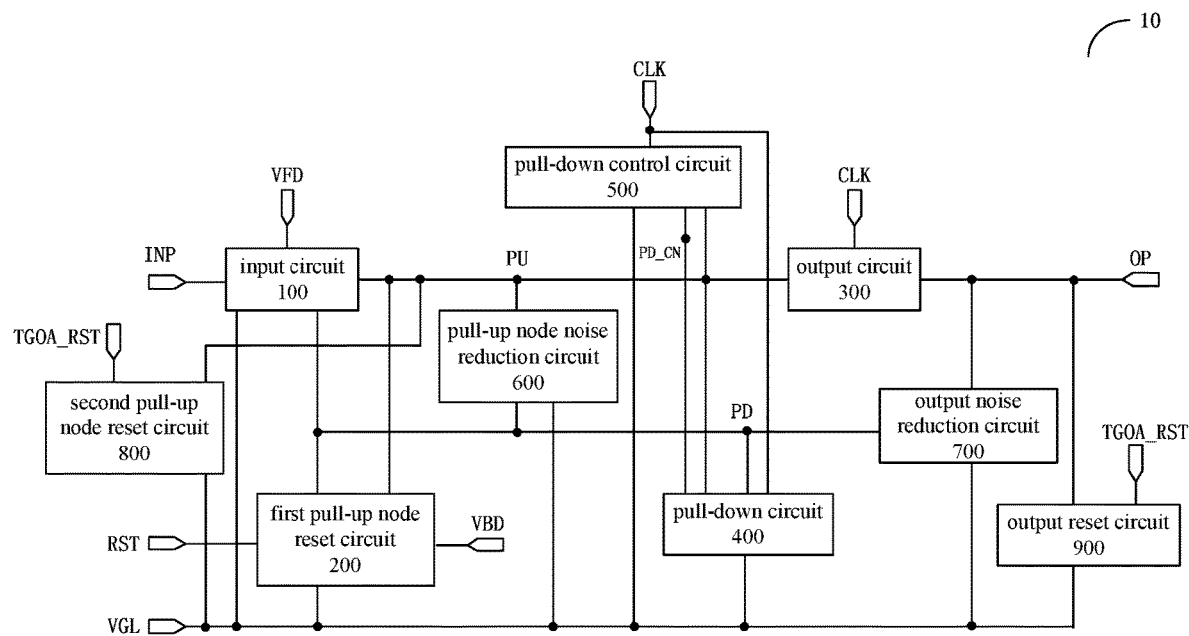
FIG. 5 is a schematic block diagram of another shift register unit provided by an embodiment of the present disclosure.

FIG. 5 is a schematic block diagram of another shift register unit provided by an embodiment of the present disclosure. Referring to FIG. 5, the shift register unit 10 may further comprise a second pull-up node reset circuit 800 and an output reset circuit 900, and other structures are substantially the same as the shift register unit 10 illustrated in FIG. 3.

The second pull-up node reset circuit 800 is configured to reset the pull-up node PU in response to a second reset signal. For example, the second pull-up node reset circuit 800 is connected to a second reset terminal TGOA_RST, the pull-up node PIJ and the second voltage terminal VGL, to electrically connect the pull-up node PU to the second voltage terminal VGL under control of the second reset signal provided by the second reset terminal TGOA_RST, so as to reset the pull-up node PU. For example, the second pull-up node reset circuit 800 can reset the pull-up node PU after the end of the scanning of a frame of image.

The output reset circuit 900 is configured to reset the output terminal OP in response to the second reset signal. For example, the output reset circuit 900 is connected to the second reset terminal TGOA_RST, the output terminal OP and the second voltage terminal VGL, to electrically connect the output terminal OP to the second voltage terminal VGL under control of the second reset signal provided by the second reset terminal TGOA_RST, so as to reset the output terminal OP. For example, the output reset circuit 900 can reset the output terminal OP after the end of the scanning of a frame of image.

Figure 6:
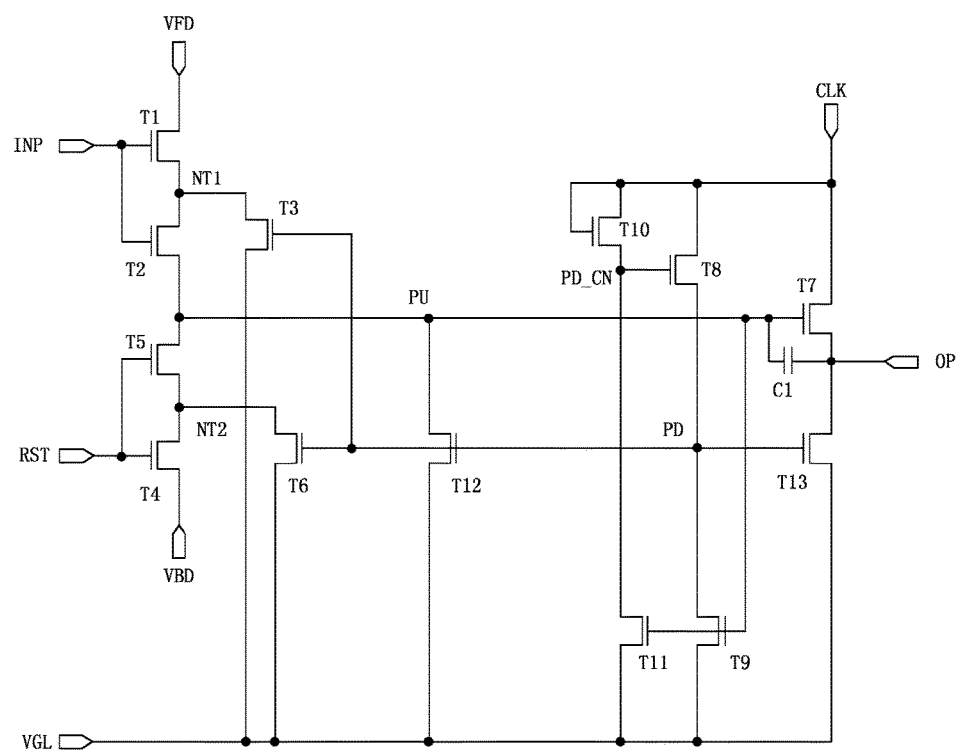
FIG. 6 is a circuit diagram of a specific implementation example of the shift register unit illustrated in FIG. 3.

FIG. 6 is a circuit diagram of a specific implementation example of the shift register unit illustrated in FIG. 3. In the following description, that each transistor is an N-type transistor is taken as an example, but it is not limitative of the embodiments of the present disclosure. Referring to FIG. 6, the shift register unit 10 comprises a first transistor to a thirteenth transistor T1-T13, and further comprises a first capacitor C1.

For example, the input circuit 100 comprises the first input sub-circuit 110, the second input sub-circuit 120 and the first node control sub-circuit 130. As illustrated in FIG. 6, the first input sub-circuit 110 may be implemented as a first transistor T1. A gate electrode of the first transistor T1 is configured to be connected to the input terminal INP to receive the input signal, a first electrode of the first transistor T1 is configured to be connected to the first voltage terminal VFD to receive the first voltage, and a second electrode of the first transistor T1 is configured to be connected to the first node NT1. The second input sub-circuit 120 may be implemented as a second transistor T2. A gate electrode of the second transistor T2 is configured to be connected to the input terminal INP to receive the input signal, a first electrode of the second transistor T2 is configured to be connected to the first node NT1, and a second electrode of the second transistor T2 is configured to be connected to the pull-up node PU. The first node control sub-circuit 130 may be implemented as a third transistor T3. A gate electrode of the third transistor T3 is configured to be connected to the pull-down node PD, a first electrode of the third transistor T3 is configured to be connected to the first node NT1, and a second electrode of the third transistor T3 is configured to be connected to the second voltage terminal VGL to receive the second voltage.

In a case where the input signal provided by the input terminal INP is at a valid level (for example, a high level), the first transistor T1 and the second transistor T2 are both turned on, so as to enable the first voltage of the first voltage terminal VFD to charge the pull-up node PU to a high level. For example, at this time, the first voltage terminal VFD is configured to keep inputting a direct-current high level signal (VDD). In a case where the pull-down node PD is at a valid level, the third transistor T3 is turned on, so as to electrically connect the first node NT1 to the second voltage terminal VGL to discharge the first node NT1. In this way, the second transistor T2 can maintain a zero bias state, thereby eliminating the risk of threshold voltage offset and preventing the pull-up node PU from forming a leakage path, so as to avoid the no-output phenomenon after the scanning direction of the GOA circuit is switched.

For example, the first pull-up node reset circuit 200 comprises the first reset sub-circuit 210, the second reset sub-circuit 220 and the second node control sub-circuit 230. As illustrated in FIG. 6, the first reset sub-circuit 210 may be implemented as a fourth transistor T4. A gate electrode of the fourth transistor T4 is configured to be connected to the first reset terminal RST to receive the first reset signal, a first electrode of the fourth transistor T4 is configured to be connected to the third voltage terminal VBD to receive the third voltage, and a second electrode of the fourth transistor T4 is configured to be connected to the second node NT2. The second reset sub-circuit 220 may be implemented as a fifth transistor T5. A gate electrode of the fifth transistor T5 is configured to be connected to the first reset terminal RST to receive the first reset signal, a first electrode of the fifth transistor T5 is configured to be connected to the second node NT2, and a second electrode of the fifth transistor T5 is configured to be connected to the pull-up node PU. The second node control sub-circuit 230 may be implemented as a sixth transistor T6. A gate electrode of the sixth transistor T6 is configured to be connected to the pull-down node PD, a first electrode of the sixth transistor T6 is configured to be connected to the second node NT2, and a second electrode of the sixth transistor T6 is configured to be connected to the second voltage terminal VGL to receive the second voltage.

In a case where the first reset signal provided by the first reset terminal RST is at a valid level, the fourth transistor T4 and the fifth transistor T5 are both turned on, so as to electrically connect the pull-up node PU to the third voltage terminal VBD to reset the pull-up node PU, allowing the pull-up node PU to drop from a high level to a low level. For example, at this time, the third voltage terminal VBD is configured to keep inputting a direct-current low level signal (VSS). In a case where the pull-down node PD is at a valid level, the sixth transistor T6 is turned on, so as to electrically connect the second node NT2 to the second voltage terminal VGL to discharge the second node NT2. In a case where the reverse scanning is performed, the first reset terminal RST provides the input signal, and the third voltage terminal VBD is switched to provide a direct-current high level signal (VDD), so as to charge the pull-up node PU. After charging, the sixth transistor T6 may be turned on to discharge the second node NT2 under control of the level of the pull-down node PD. In this way, the fifth transistor T5 can maintain a zero bias state, thereby eliminating the risk of threshold voltage offset and preventing the pull-up node PU from forming a leakage path, so as to avoid the no-output phenomenon after the scanning direction of the GOA circuit is switched.

The output circuit 300 may be implemented as a seventh transistor T7 and a first capacitor C1. A gate electrode of the seventh transistor T7 is configured to be connected to the pull-up node PU, a first electrode of the seventh transistor T7 is configured to be connected to the clock signal terminal CLK to receive the clock signal, and a second electrode of the seventh transistor T7 is configured to be connected to the output terminal OP. A first electrode of the first capacitor C1 is configured to be connected to the gate electrode of the seventh transistor T7, and a second electrode of the first capacitor C is configured to be connected to the second electrode of the seventh transistor T7. In a case where the level of the pull-up node PU is at a valid level, the seventh transistor T7 is turned on, thereby outputting the clock signal to the output terminal OP.

The pull-down circuit 400 may be implemented as an eighth transistor T8 and a ninth transistor 19. A gate electrode of the eighth transistor T8 is configured to be connected to the pull-down control node PD_CN, a first electrode of the eighth transistor T8 is configured to be connected to the clock signal terminal CLK to receive the clock signal, and a second electrode of the eighth transistor T8 is configured to be connected to the pull-down node PD. A gate electrode of the ninth transistor T9 is configured to be connected to the pull-up node PU, a first electrode of the ninth transistor T9 is configured to be connected to the pull-down node PD, and a second electrode of the ninth transistor T9 is configured to be connected to the second voltage terminal VGL to receive the second voltage.

The pull-down control circuit 500 may be implemented as a tenth transistor T10 and an eleventh transistor T11. A gate electrode of the tenth transistor T10 is connected to a first electrode of the tenth transistor T10 and is configured to be connected to the clock signal terminal CLK to receive the clock signal, and a second electrode of the tenth transistor T10 is configured to be connected to the pull-down control node PD_CN. A gate electrode of the eleventh transistor T11 is configured to be connected to the pull-up node PU, a first electrode of the eleventh transistor T11 is configured to be connected to the pull-down control node PD_CN, and a second electrode of the eleventh transistor T11 is configured to be connected to the second voltage terminal VGL to receive the second voltage.

The pull-up node noise reduction circuit 600 may be implemented as a twelfth transistor T12. A gate electrode of the twelfth transistor T12 is configured to be connected to the pull-down node PD, a first electrode of the twelfth transistor T12 is configured to be connected to the pull-up node PU, and a second electrode of the twelfth transistor T12 is configured to be connected to the second voltage terminal VGL to receive the second voltage. In a case where the pull-down node PD is at a valid level, the twelfth transistor T12 is turned on to electrically connect the pull-up node PU to the second voltage terminal VGL, so as to pull down the pull-up node PU to achieve noise reduction.

The output noise reduction circuit 700 may be implemented as a thirteenth transistor T13. A gate electrode of the thirteenth transistor T13 is configured to be connected to the pull-down node PD, a first electrode of the thirteenth transistor T13 is configured to be connected to the output terminal OP, and a second electrode of the thirteenth transistor T13 is configured to be connected to the second voltage terminal VGL to receive the second voltage. In a case where the pull-down node PD is at a valid level, the thirteenth transistor T13 is turned on to electrically connect the output terminal OP to the second voltage terminal VGL, so as to perform noise reduction on the output terminal OP.

Figure 7:
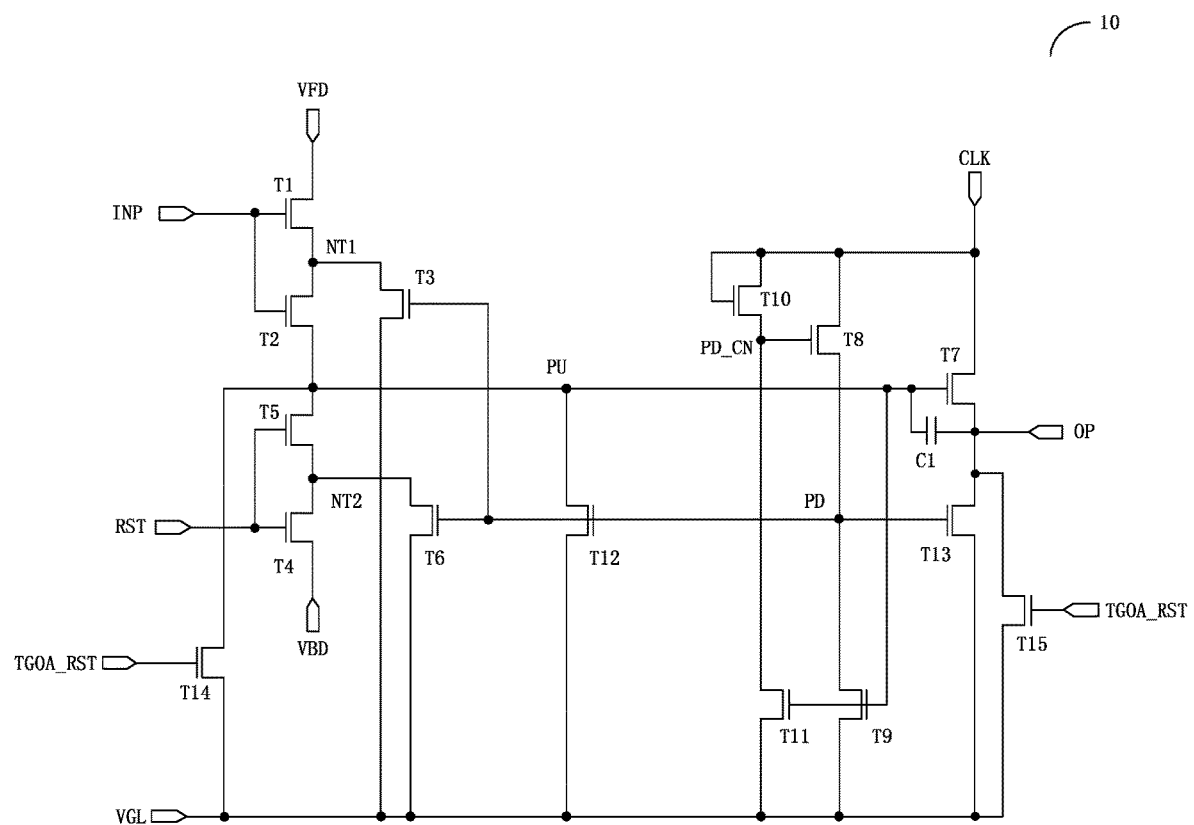
FIG. 7 is a circuit diagram of a specific implementation example of the shift register unit illustrated in FIG. 5.

FIG. 7 is a circuit diagram of a specific implementation example of the shift register unit illustrated in FIG. 5. Referring to FIG. 7, the shift register unit 10 of the embodiment is substantially the same as the shift register unit 10 illustrated in FIG. 6, except further comprising a fourteenth transistor T14 and a fifteenth transistor T15.

In this embodiment, the second pull-up node reset circuit 800 may be implemented as the fourteenth transistor T14. A gate electrode of the fourteenth transistor T14 is configured to be connected to the second reset terminal TGOA_RST to receive the second reset signal, a first electrode of the fourteenth transistor T14 is configured to be connected to the pull-up node PU, and a second electrode of the fourteenth transistor T14 is configured to be connected to the second voltage terminal VGL to receive the second voltage. In a case where the second reset signal is at a valid level, the fourteenth transistor T14 is turned on to electrically connect the pull-up node PU to the second voltage terminal VGL, so as to reset the pull-up node PU.

The output reset circuit 900 may be implemented as the fifteenth transistor T15. A gate electrode of the fifteenth transistor T15 is configured to be connected to the second reset terminal TGOA_RST to receive the second reset signal, a first electrode of the fifteenth transistor T15 is configured to be connected to the output terminal OP, and a second electrode of the fifteenth transistor T15 is configured to be connected to the second voltage terminal VGL to receive the second voltage. In a case where the second reset signal is at a valid level, the fifteenth transistor T15 is turned on to electrically connect the output terminal OP to the second voltage terminal VGL, so as to reset the output terminal OP.

It should be noted that in the description of the embodiments of the present disclosure, the pull-up node PU, the pull-down node PD, the first node NT1 and the second node NT2 do not represent actual components, but represent junctions of related electrical connections in the circuit diagram.

It should be noted that the transistors used in the embodiments of the present disclosure may be thin film transistors, field effect transistors or other switching devices with the same characteristics, and in the embodiments of the present disclosure, the thin film transistors are taken as an example for description. The source electrode and the drain electrode of the transistor used here can be symmetrical in structure, so the source electrode and the drain electrode thereof can be indistinguishable in structure. In the embodiments of the present disclosure, in order to distinguish the two electrodes of the transistor except the gate electrode, one of the two electrodes is directly described as the first electrode, and the other is described as the second electrode.

In addition, the transistors in the embodiments of the present disclosure are all described by taking an N-type transistor as an example, and in this case, the first electrode of the transistor is the drain electrode and the second electrode is the source electrode. It should be noted that the present disclosure comprises but is not limited thereto. For example, one or more transistors of the shift register unit 10 provided by the embodiments of the present disclosure may also adopt a P-type transistor, and in this case, the first electrode of the transistor is the source electrode and the second electrode is the drain electrode, which only needs to correspondingly connect each electrode of the transistors of the selected type with reference to each electrode of the corresponding transistors in the embodiments of the present disclosure. In a case where the N-type transistor is used, an indium gallium zinc oxide (IGZO) may be used as the active layer of the thin film transistor, and comparing with a low temperature poly silicon (LTPS) or an amorphous silicon (such as a hydrogenated amorphous silicon) being used as the active layer of the thin film transistor, IGZO can effectively reduce the size of the transistor and prevent the leakage current.

Figure 8:
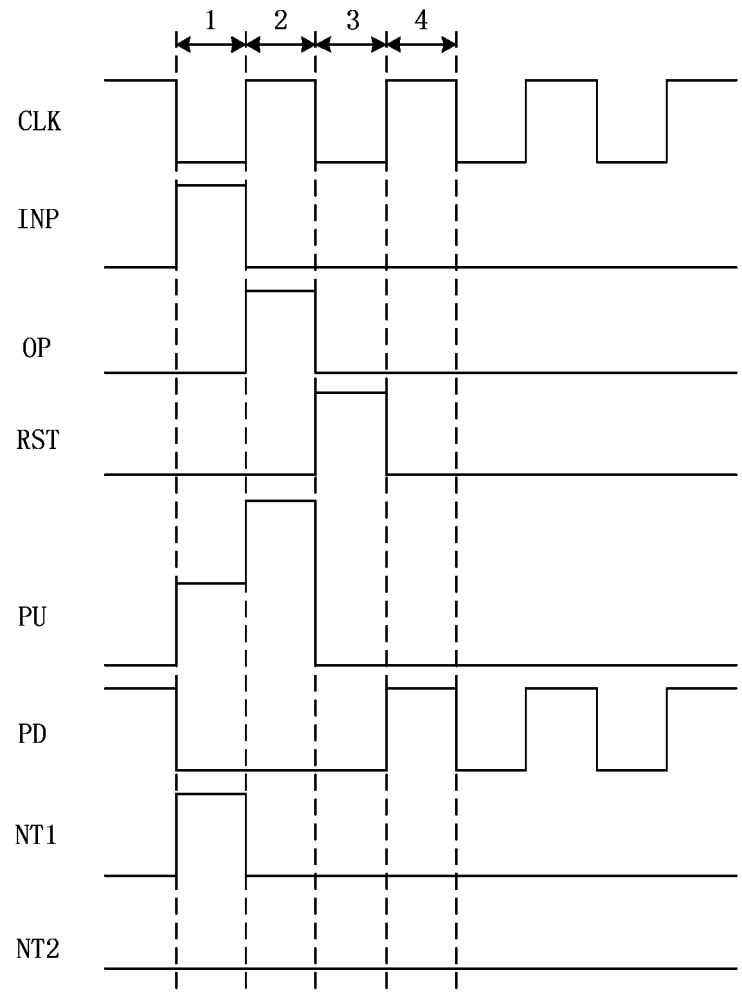
FIG. 8 is a timing diagram of signals of a shift register unit provided by an embodiment of the present disclosure.

FIG. 8 is a timing diagram of signals of a shift register unit provided by an embodiment of the present disclosure. In the following description, the working principle of the shift register unit 10 illustrated in FIG. 7 is described with reference to the timing diagram of signals illustrated in FIG. 8, and here each transistor is described by taking the N-type transistor as an example, but the embodiments of the present disclosure is not limited thereto. In four phases of a first phase 1, a second phase 2, a third phase 3 and a fourth phase 4 as illustrated in FIG. 8, the shift register unit 10 may perform the following operations respectively.

In the first phase 1 (i.e., an input phase), the input terminal INP provides a high level signal, the first voltage terminal VFD is configured to provide the direct-current high level signal (VDD), the first transistor T1 and the second transistor T2 are turned on, electric potentials of the first node NT1 and the pull-up node PU rise, and the pull-up node PU is charged to the first level. The seventh transistor T7 is turned on, and outputs the clock signal of the clock signal terminal CLK to the output terminal OP. At this time, the clock signal is at a low level, so the output terminal OP outputs the low level. Because the clock signal is at a high level in the previous phase, the pull-down control node PD_CN is also at the high level. In the first phase 1, the pull-down control node PD_CN is kept at the high level, so as to enable the eighth transistor T8 to be turned on and the pull-down node PD to be discharged to the low level through the clock signal terminal CLK. The third transistor T3 is turned off under control of the low level of the pull-down node PD, so the charging process of the pull-up node PU is not affected, so that the ninth transistor T9 has a large offset margin of the threshold voltage and the requirements for process conditions are loose.

In the second phase 2 (i.e., an output phase), the input signal changes to the low level, and the first transistor T1 and the second transistor T2 are turned off. The first node NT1 is dropped to the low level due to the coupling effect. The clock signal changes to the high level, the electric potential of the pull-up node PU further rises due to the coupling effect of the clock signal, the seventh transistor T7 is fully turned on, and the high level of the clock signal is outputted to the output terminal OP. The ninth transistor T9 and the eleventh transistor T11 are turned on by the high level of the pull-up node PU. The tenth transistor T10 is turned on by the high level of the clock signal. Because the tenth transistor T10 and the eleventh transistor T11 are in series connection and divide the voltage, the pull-down control node PD_CN changes to the low level, thereby enabling the eighth transistor T8 to be turned off, and thus the pull-down node PD still remains at the low level.

In the third phase 3 (i.e., a reset phase), the first reset terminal RST provides a high level signal, the third voltage terminal VBD is configured to provide the direct-current low level signal (VSS), and the fourth transistor T4 and the fifth transistor T5 are turned on, thereby resetting the pull-up node PU to the low level. The seventh transistor T7 is turned off by the low level of the pull-up node PU, thereby enabling the output terminal OP to be turned off, that is, the output terminal OP outputs a low level signal. The pull-down node PD still remains at the low level during this phase.

In the fourth phase 4 (i.e., a discharging phase), the ninth transistor T9 and the eleventh transistor T11 are turned off by the low level of the pull-up node PU. The clock signal changes to the high level and charges the pull-down control node PD_CN through the tenth transistor T10, thereby enabling the eighth transistor T8 to be turned on. The clock signal charges the pull-down node PD through the eighth transistor T8, enabling the pull-down node PD to change to the high level. The twelfth transistor T12 and the thirteenth transistor T13 are turned on by the high level of the pull-down node PD, respectively electrically connecting the pull-up node PU and the output terminal OP to the second voltage terminal VGL, so as to perform noise reduction on the pull-up node PU and the output terminal OP. The third transistor T3 is also turned on by the high level of the pull-down node PD, so as to electrically connect the first node NT1 to the second voltage terminal VGL, thereby discharging the first node NT1. In this way, the second transistor T2 can maintain a zero bias state (the first node NT1 and the pull-up node PU are both at the low level) in the subsequent phases, thereby eliminating the risk of threshold voltage offset and preventing the pull-up node PU from forming a leakage path. In a case where the shift register unit 10 performs the forward scanning (that is, providing the input signal for the input terminal INP and providing the first reset signal for the first reset terminal RST) for a long time and then is switched to the reverse scanning, even if the first transistor T1 occurs a negative offset of the threshold voltage due to the negative bias thermal stress (NBTS), since the threshold voltage of the second transistor T2 is not offset, the circuit does not leak on the pull-up node PU, so as to avoid the no-output phenomenon after the scanning direction of the GOA circuit is switched.

In subsequent phases, in a case where the clock signal is at the low level, because the pull-down control node PD_CN stores the high level, the eighth transistor T8 is turned on, thereby enabling the pull-down node PD to be discharged to the low level through the eighth transistor T8. In a case where the clock signal is at the high level, similar to the working principle of the fourth phase 4, the clock signal charges the pull-down node PD through the eighth transistor T8, enabling the pull-down node PD to changes to the high level. Thus, it can be realized that the electric potential of the pull-down node PD changes with the clock signal. The third transistor T3, the sixth transistor T6, the twelfth transistor T12 and the thirteenth transistor T13 are alternately turned on and turned off under control of the level of the pull-down node PD, thereby bearing 50% stress during the entire frame scanning process. In this way, the degradation of device performance can be slowed down and the threshold voltage offset can be prevented.

For example, after the end of a frame scanning, the second reset terminal TGOA_RST may provide a high level signal (not illustrated in FIG. 8), thereby enabling the fourteenth transistor T14 and the fifteenth transistor T15 to be turned on, so as to electrically connect the pull-up node PU and the output terminal OP to the second voltage terminal VGL, respectively, to reset the pull-up node PU and the output terminal OP.

For example, in a case where the shift register unit 10 performs the reverse scanning, the input signal and the first reset signal are exchanged with each other, that is, the first reset signal is provided for the input terminal INP, and the input signal is provided for the first reset terminal RST. At this time, the first voltage terminal VFD provides the direct-current low level signal (VSS), and the third voltage terminal VBD provides the direct-current high level signal (VDD). During the reverse scanning, the working principle of the shift register unit 10 is similar to that during the forward scanning, and is not described again. It should be noted that the sixth transistor T6 is turned on under control of the level of the pull-down node PD to discharge the second node NT2, thereby enabling the fifth transistor T5 to maintain a zero bias state in each phase after the fourth phase 4, so as to eliminate the risk of threshold voltage offset and prevent the pull-up node PU from forming a leakage path.

At least one embodiment of the present disclosure further provides a gate driving circuit. The gate driving circuit comprises the shift register unit provided by any one of the embodiments of the present disclosure. The gate driving circuit can avoid the no-output phenomenon after the scanning direction is switched due to the negative offset of the threshold voltage of the transistor at the input terminal, which enhances the reliability of the circuit and provides a large offset margin of the threshold voltage.

Figure 9:
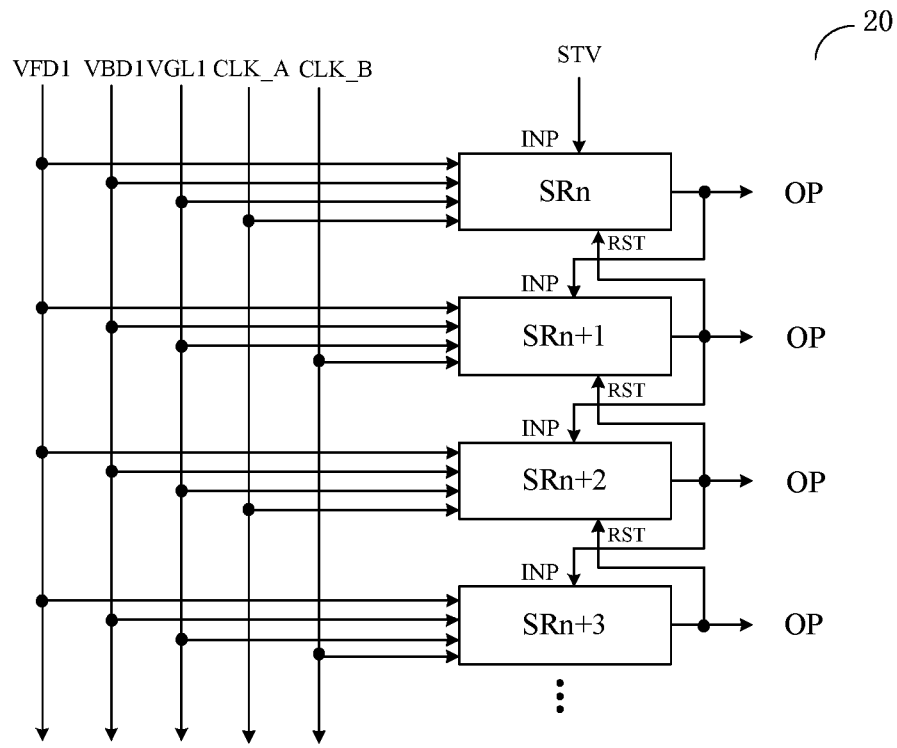
FIG. 9 is a schematic block diagram of a gate driving circuit provided by an embodiment of the present disclosure.

FIG. 9 is a schematic block diagram of a gate driving circuit provided by an embodiment of the present disclosure. Referring to FIG. 9, a gate driving circuit 20 comprises a plurality of cascaded shift register units (SRn, SRn+1, SRn+2, SRn+3, etc.). The number of the plurality of shift register units is not limited and can be determined according to actual demands. For example, for a display device with resolution ratio of 640×480, the number of the shift register units can be 480, and correspondingly, for a display device with resolution ratio of 1920×1440, the number of the shift register units can be 1440. For example, the shift register unit applies the shift register unit 10 provided by any one of the embodiments of the present disclosure. For example, in the gate driving circuit 20, the shift register unit 10 provided by any one of the embodiments of the present disclosure can be applied in part or all of the shift register units. The gate driving circuit 20 can be directly integrated on the array substrate of the display device by a process similar to the process of the thin film transistor, to achieve a progressive scanning driving function.

For example, the plurality of shift register units have the input terminal INP, the first reset terminal RST and the output terminal OP, respectively. For example, in addition to the first shift register unit, the output terminal OP of each shift register unit is connected to the first reset terminal RST of the previous shift register unit. For example, in addition to the last shift register unit, the output terminal OP of each shift register unit is connected to the input terminal INP of the next shift register unit. For example, the input terminal INP of the first shift register unit is configured to receive a trigger signal STV; and the first reset terminal RST of the last shift register unit is configured to receive an additionally provided reset signal. Obviously, what is described above is the case of forward scanning, and during the reverse scanning, the trigger signal STV for the first shift register unit described above is replaced with the reset signal described above, and the reset signal for the last shift register unit described above is replaced with the trigger signal STV.

For example, the gate driving circuit 20 further comprises a first system clock CLK_A and a second system clock CLK_B, and clock signals outputted from the two system clocks, for example, are complementary to each other. For example, the odd-numbered shift register units (for example, SRn and SRn+2) are connected to the first system clock CLK_A to receive the clock signal, and the even-numbered shift register units (for example, SRn+1 and SRn+3) are connected to the second system clock CLK_B to receive the clock signal, so as to ensure that the output signals of the output terminals OP of each shift register unit are shifted and connected with each other in timing. For example, the gate driving circuit 20 may further comprise a timing controller, and the timing controller, for example, is configured to provide the first system clock signal and the second system clock signal for each shift register unit, and may be further configured to provide the trigger signal STV. In different examples, according to different configurations, more system clocks can be provided, such as four, six and the like.

For example, the gate driving circuit 20 further comprises a first voltage line VFD1, a second voltage line VGL1 and a third voltage line VBD1, so as to provide the first voltage, the second voltage and the third voltage for each shift register unit.

For example, when using the gate driving circuit 20 to drive a display panel, the gate driving circuit 20 can be disposed on one side of the display panel. For example, the display panel comprises a plurality of rows of gate lines, and the output terminals OP of each shift register unit of the gate driving circuit 20 can be configured to be sequentially connected to the plurality of rows of gate lines for outputting gate scanning signals. Obviously, the gate driving circuit 20 can also be disposed on both sides of the display panel respectively, to implement bilateral driving, and the embodiments of the present disclosure does not limit the configuration of the gate driving circuit 20. For example, a gate driving circuit 20 can be disposed on one side of the display panel for driving the odd-numbered rows of gate lines, and another gate driving circuit 20 can be disposed on the other side of the display panel for driving the even-numbered rows of gate lines.

At least one embodiment of the present disclosure further provides a display device. The display device comprises the gate driving circuit provided by any one of the embodiments of the present disclosure. The gate driving circuit of the display device can avoid the no-output phenomenon after the scanning direction is switched due to the negative offset of the threshold voltage of the transistor at the input terminal, which enhances the reliability of the circuit and provides a large offset margin of the threshold voltage.

Figure 10:
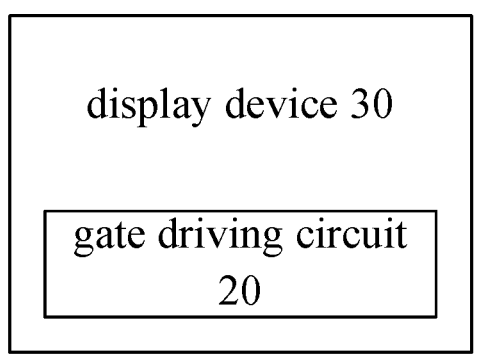
FIG. 10 is a schematic block diagram of a display device provided by an embodiment of the present disclosure.

FIG. 10 is a schematic block diagram of a display device provided by an embodiment of the present disclosure. Referring to FIG. 10, a display device 30 comprises a gate driving circuit 20, and the gate driving circuit 20 is the gate driving circuit provided by any one of the embodiments of the present disclosure. For example, the display device 30 may be any product or component with display function, such as a liquid crystal panel, a liquid crystal television, a display, an organic light-emitting diode (OLED) panel, an OLED television, an electronic paper display device, a mobile phone, a tablet computer, a notebook computer, a digital photo frame, a navigator and the like, which is not limited in the embodiments of the present disclosure. The technical effect of the display device 30 can refer to the corresponding description of the shift register unit 10 and the gate driving circuit 20 of the above embodiments, and is not described again.

Figure 11:
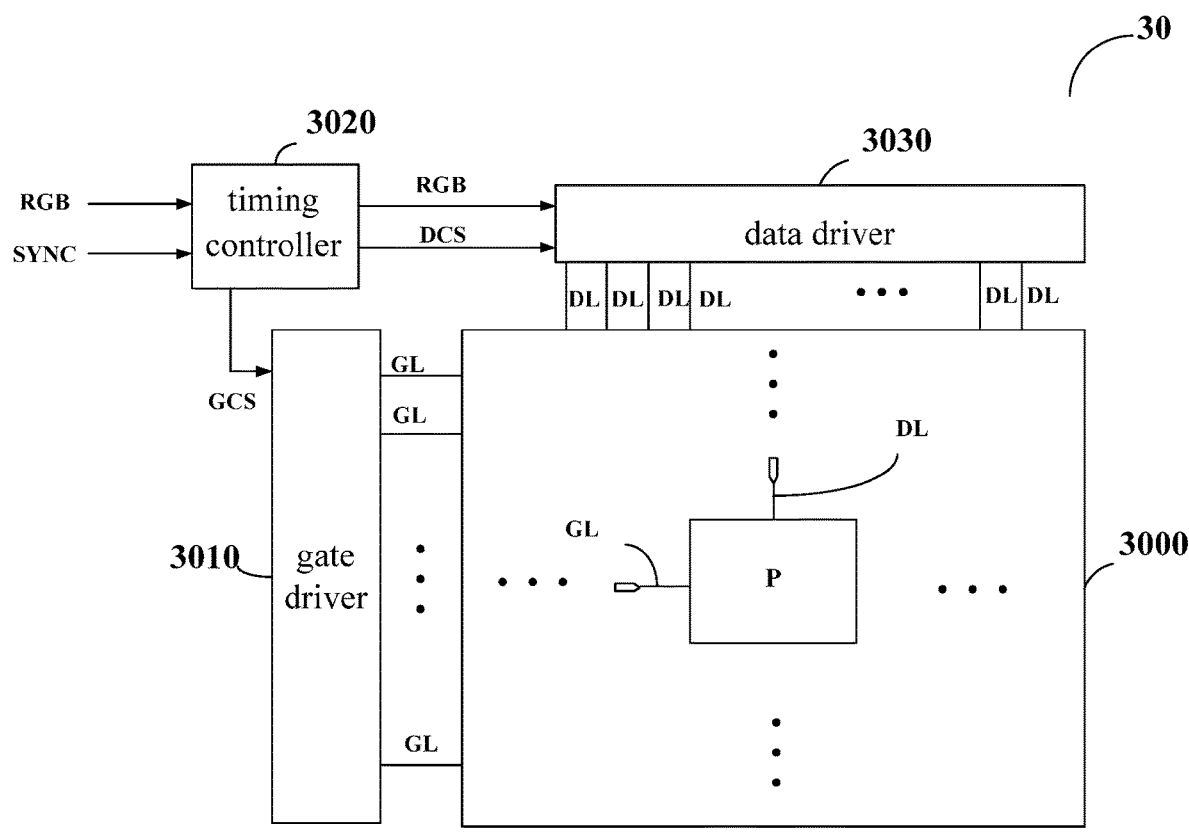
FIG. 11 is a schematic block diagram of another display device provided by an embodiment of the present disclosure.

FIG. 11 is a schematic block diagram of another display device provided by an embodiment of the present disclosure. Referring to FIG. 11, a display device 30 comprises a display panel 3000, a gate driver 3010, a timing controller 3020 and a data driver 3030. The display panel 3000 comprises a plurality of pixel units P defined according to the cross of a plurality of scanning lines GL and a plurality of data lines DL; the gate driver 3010 is used for driving the plurality of scanning lines GL; the data driver 3030 is used for driving the plurality of data lines DL; and the timing controller 3020 is used for processing image data RGB inputted from the outside of the display device 30, providing the processed image data RGB for the data driver 3030 and outputting scanning control signals GCS and data control signals DCS for the gate driver 3010 and the data driver 3030, so as to control the gate driver 3010 and the data driver 3030.

For example, the gate driver 3010 comprises the gate driving circuit 20 provided by any one of the above embodiments. The output terminals OP of the plurality of shift register units of the gate driving circuit 20 are correspondingly connected to the plurality of scanning lines GL. The plurality of scanning lines GL are correspondingly connected to the pixel units P arranged in the plurality of rows. The output terminals OP of each shift register unit of the gate driving circuit 20 sequentially output signals to the plurality of scanning lines GL, so as to enable the plurality of rows of pixel units P of the display panel 3000 to achieve the progressive scanning.

For example, the data driver 3030 converts the digital image data RGB inputted from the timing controller 3020 into data signals using a reference gamma voltage according to a plurality of data control signals DCS derived from the timing controller 3020. The data driver 3030 provides the converted data signals for the plurality of data lines DL.

For example, the timing controller 3020 processes the externally inputted image data RGB to match the size and resolution ratio of the display panel 3000, and then provides the processed image data for the data driver 3030. The timing controller 3020 generates the plurality of scanning control signals GCS and the plurality of data control signals DCS using synchronizing signals (for example, a dot clock DCLK, a data enable signal DE, a horizontal synchronizing signal Hsync and a vertical synchronizing signal Vsync) inputted from the outside of the display device 30. The timing controller 3020 provides the generated scanning control signals GCS and the data control signals DCS for the gate driver 3010 and the data driver 3030 respectively, so as to control the gate driver 3010 and the data driver 3030.

For example, the gate driver 3010 and the data driver 3030 can be implemented as a semiconductor chip. The display device 30 may further comprise other components, such as a signal decoding circuit, a voltage conversion circuit, etc., which for example, may use existing conventional components, and will not be described in detail here.

At least one embodiment of the present disclosure further provides a method of driving a shift register unit, which can be used for driving the shift register unit 10 provided by any one of the embodiments of the present disclosure. Using the method can avoid the no-output phenomenon of the GOA circuit after the scanning direction is switched due to the negative offset of the threshold voltage of the transistor at the input terminal, which enhances the reliability of the circuit and provides a large offset margin of the threshold voltage.

For example, in an example, the method of driving the shift register unit comprises the following operations:

in a first phase, the input circuit 100 controls the level of the pull-up node PU to the first level in response to the input signal, and the output circuit 300 outputs a third level of the clock signal to the output terminal OP;

in a second phase, the output circuit 300 outputs a fourth level of the clock signal to the output terminal OP;

in a third phase, the first pull-up node reset circuit 200 resets the pull-up node PU under control of the first reset signal; and in a fourth phase, the input circuit 100 controls the level of the first node NT1 to the second level under control of the level of the pull-down node PD.

For example, the third level is a low level, and the fourth level is a high level. The following embodiments are the same as the above, which is not described again.

For example, in another example, in a case where the display panel adopting the shift register unit 10 performs the reverse scanning, the input signal and the first reset signal can be exchanged with each other, that is, the input signal is provided for the first reset terminal RST and the first reset signal is provided for the input terminal INP. At this time, the method of driving the shift register unit comprises the following operations:

in a first phase, the first pull-up node reset circuit 200 controls the level of the pull-up node PU to the first level in response to the input signal, and the output circuit 300 outputs a third level of the clock signal to the output terminal OP;

in a second phase, the output circuit 300 outputs a fourth level of the clock signal to the output terminal OP;

in a third phase, the input circuit 100 resets the pull-up node PU under control of the first reset signal; and in a fourth phase, the first pull-up node reset circuit 200 controls the level of the second node NT2 to the second level under control of the level of the pull-down node PD.

It should be noted that the detailed description and the technical effect of the method can refer to the description of the working principle of the shift register unit 10 in the embodiments of the present disclosure, which is not described again.

The following is to be noted:

(1) The drawings of the present disclosure only relate to the structures relevant to the embodiments of the present disclosure, and other structures may be referred to the common design;

(2) In the case of no conflict, the embodiments of the present disclosure and the features of the embodiments may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising an input circuit, a first pull-up node reset circuit, and an output circuit;

wherein the input circuit comprises an input terminal, and is configured to control an level of a pull-up node to a first level in response to an input signal of the input terminal, and thereafter control a level of a first node to a second level under control of a level of a pull-down node, in which the first node is in a current path for controlling the level of the pull-up node;

the first pull-up node reset circuit is configured to reset the pull-up node in response to a first reset signal; and the output circuit is configured to output a clock signal to an output terminal under control of the level of the pull-up node;

the input circuit comprises a first input sub-circuit, a second input sub-circuit, and a first node control sub-circuit;

the first input sub-circuit is configured to control the level of the first node to the first level in response to the input signal;

the second input sub-circuit is configured to control the level of the pull-up node to the first level in response to the input signal; and the first node control sub-circuit is configured to control the level of the first node to the second level under control of the level of the pull-down node.

2. The shift register unit according to claim 1, wherein the first input sub-circuit comprises:

a first transistor, in which a gate electrode of the first transistor is configured to be connected to the input terminal to receive the input signal, a first electrode of the first transistor is configured to be connected to a first voltage terminal to receive a first voltage, and a second electrode of the first transistor is configured to be connected to the first node;

the second input sub-circuit comprises: a second transistor, in which a gate electrode of the second transistor is configured to be connected to the input terminal to receive the input signal, a first electrode of the second transistor is configured to be connected to the first node, and a second electrode of the second transistor is configured to be connected to the pull-up node; and the first node control sub-circuit comprises: a third transistor, in which a gate electrode of the third transistor is configured to be connected to the pull-down node, a first electrode of the third transistor is configured to be connected to the first node, and a second electrode of the third transistor is configured to be connected to a second voltage terminal to receive a second voltage.

3. The shift register unit according to claim 1, further comprising a pull-down circuit, a pull-down control circuit, a pull-up node noise reduction circuit, and an output noise reduction circuit;

wherein the pull-down circuit is configured to control the level of the pull-down node under control of the level of the pull-up node and a level of a pull-down control node;

the pull-down control circuit is configured to control the level of the pull-down control node under control of the level of the pull-up node;

the pull-up node noise reduction circuit is configured to perform noise reduction on the pull-up node under control of the level of the pull-down node; and the output noise reduction circuit is configured to perform noise reduction on the output terminal under control of the level of the pull-down node.

4. The shift register unit according to claim 3, wherein the pull-down circuit comprises an eighth transistor and a ninth transistor;

a gate electrode of the eighth transistor is configured to be connected to the pull-down control node, a first electrode of the eighth transistor is configured to be connected to a clock signal terminal to receive the clock signal, and a second electrode of the eighth transistor is configured to be connected to the pull-down node; and a gate electrode of the ninth transistor is configured to be connected to the pull-up node, a first electrode of the ninth transistor is configured to be connected to the pull-down node, and a second electrode of the ninth transistor is configured to be connected to a second voltage terminal to receive a second voltage.

5. The shift register unit according to claim 3, wherein the pull-down control circuit comprises a tenth transistor and an eleventh transistor;

a gate electrode of the tenth transistor is connected to a first electrode of the tenth transistor and configured to be connected to a clock signal terminal to receive the clock signal, and a second electrode of the tenth transistor is configured to be connected to the pull-down control node; and a gate electrode of the eleventh transistor is configured to be connected to the pull-up node, a first electrode of the eleventh transistor is configured to be connected to the pull-down control node, and a second electrode of the eleventh transistor is configured to be connected to a second voltage terminal to receive a second voltage.

6. The shift register unit according to claim 3, wherein the pull-up node noise reduction circuit comprises a twelfth transistor; and a gate electrode of the twelfth transistor is configured to be connected to the pull-down node, a first electrode of the twelfth transistor is configured to be connected to the pull-up node, and a second electrode of the twelfth transistor is configured to be connected to a second voltage terminal to receive a second voltage.

7. The shift register unit according to claim 3, wherein the output noise reduction circuit comprises a thirteenth transistor; and a gate electrode of the thirteenth transistor is configured to be connected to the pull-down node, a first electrode of the thirteenth transistor is configured to be connected to the output terminal, and a second electrode of the thirteenth transistor is configured to be connected to a second voltage terminal to receive a second voltage.

8. The shift register unit according to claim 1, wherein the first pull-up node reset circuit is further configured to control a level of a second node to the second level under control of the level of the pull-down node, and the second node is in a reset path for resetting the pull-up node.

9. The shift register unit according to claim 8, wherein the first pull-up node reset circuit comprises a first reset sub-circuit, a second reset sub-circuit, and a second node control sub-circuit;

the first reset sub-circuit is configured to reset the second node in response to the first reset signal;

the second reset sub-circuit is configured to reset the pull-up node in response to the first reset signal; and the second node control sub-circuit is configured to control the level of the second node to the second level under control of the level of the pull-down node.

10. The shift register unit according to claim 9, wherein the first reset sub-circuit comprises:

a fourth transistor, in which a gate electrode of the fourth transistor is configured to be connected to a first reset terminal to receive the first reset signal, a first electrode of the fourth transistor is configured to be connected to a third voltage terminal to receive a third voltage, and a second electrode of the fourth transistor is configured to be connected to the second node;

the second reset sub-circuit comprises: a fifth transistor, in which a gate electrode of the fifth transistor is configured to be connected to the first reset terminal to receive the first reset signal, a first electrode of the fifth transistor is configured to be connected to the second node, and a second electrode of the fifth transistor is configured to be connected to the pull-up node; and the second node control sub-circuit comprises: a sixth transistor, in which a gate electrode of the sixth transistor is configured to be connected to the pull-down node, a first electrode of the sixth transistor is configured to be connected to the second node, and a second electrode of the sixth transistor is configured to be connected to a second voltage terminal to receive a second voltage.

11. A method of driving the shift register unit according to claim 8, wherein the input signal and the first reset signal are exchanged with each other, and the method comprises:

in a first phase, the first pull-up node reset circuit controls the level of the pull-up node to the first level in response to the input signal, and the output circuit outputs a third level of the clock signal to the output terminal;

in a second phase, the output circuit outputs a fourth level of the clock signal to the output terminal;

in a third phase, the input circuit resets the pull-up node under control of the first reset signal; and in a fourth phase, the first pull-up node reset circuit controls the level of the second node to the second level under control of the level of the pull-down node.

12. The shift register unit according to claim 1, wherein the output circuit comprises a seventh transistor and a first capacitor;

a gate electrode of the seventh transistor is configured to be connected to the pull-up node, a first electrode of the seventh transistor is configured to be connected to a clock signal terminal to receive the clock signal, and a second electrode of the seventh transistor is configured to be connected to the output terminal; and a first electrode of the first capacitor is configured to be connected to the gate electrode of the seventh transistor, and a second electrode of the first capacitor is configured to be connected to the second electrode of the seventh transistor.

13. The shift register unit according to claim 1, further comprising a second pull-up node reset circuit;

wherein the second pull-up node reset circuit is configured to reset the pull-up node in response to a second reset signal.

14. The shift register unit according to claim 13, wherein the second pull-up node reset circuit comprises a fourteenth transistor; and a gate electrode of the fourteenth transistor is configured to be connected to a second reset terminal to receive the second reset signal, a first electrode of the fourteenth transistor is configured to be connected to the pull-up node, and a second electrode of the fourteenth transistor is configured to be connected to a second voltage terminal to receive a second voltage.

15. The shift register unit according to claim 1, further comprising an output reset circuit;

wherein the output reset circuit is configured to reset the output terminal in response to a second reset signal.

16. The shift register unit according to claim 15, wherein the output reset circuit comprises a fifteenth transistor; and a gate electrode of the fifteenth transistor is configured to be connected to a second reset terminal to receive the second reset signal, a first electrode of the fifteenth transistor is configured to be connected to the output terminal, and a second electrode of the fifteenth transistor is configured to be connected to a second voltage terminal to receive a second voltage.

17. A gate driving circuit, comprising the shift register unit according to claim 1.

18. A display device, comprising the gate driving circuit according to claim 17.

19. A method of driving the shift register unit according to claim 1, comprising:

in a first phase, the input circuit controlling the level of the pull-up node to the first level in response to the input signal, and the output circuit outputting a third level of the clock signal to the output terminal;

in a second phase, the output circuit outputting a fourth level of the clock signal to the output terminal;

in a third phase, the first pull-up node reset circuit resetting the pull-up node under control of the first reset signal; and in a fourth phase, the input circuit controlling the level of the first node to the second level under control of the level of the pull-down node.

* * * * *